United States Patent
Cok et al.

(10) Patent No.: US 7,859,188 B2
(45) Date of Patent: Dec. 28, 2010

(54) LED DEVICE HAVING IMPROVED CONTRAST

(75) Inventors: Ronald S. Cok, Rochester, NY (US);
Yuan-Sheng Tyan, Webster, NY (US);
Joel D. Shore, Rochester, NY (US);
Donald R. Preuss, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 589 days.

(21) Appl. No.: 11/842,221

(22) Filed: Aug. 21, 2007

(65) Prior Publication Data

US 2009/0051283 A1    Feb. 26, 2009

(51) Int. Cl.
*H01J 1/62* (2006.01)

(52) U.S. Cl. .................. 313/506; 313/503; 313/505

(58) Field of Classification Search ............ 313/503, 313/505, 506
See application file for complete search history.

(56) References Cited

U.S. PATENT DOCUMENTS

| | | | |
|---|---|---|---|
| 5,554,911 | A | 9/1996 | Nakayama et al. |
| 5,949,187 | A | 9/1999 | Xu et al. |
| 6,384,529 | B2 | 5/2002 | Tang et al. |
| 6,680,570 | B2 | 1/2004 | Roitman et al. |
| 6,861,800 | B2 | 3/2005 | Tyan et al. |
| 6,987,355 | B2 | 1/2006 | Cok |
| 7,030,553 | B2 | 4/2006 | Winters et al. |
| 7,271,537 | B2* | 9/2007 | Matsuda et al. ............ 313/506 |
| 2005/0225232 | A1* | 10/2005 | Boroson et al. ............ 313/504 |
| 2006/0066228 | A1 | 3/2006 | Antoniadis |
| 2006/0138945 | A1* | 6/2006 | Wolk et al. ................. 313/506 |
| 2006/0232202 | A1* | 10/2006 | Matsuda et al. ............ 313/506 |
| 2009/0051284 | A1* | 2/2009 | Cok et al. .................. 313/506 |
| 2009/0085478 | A1* | 4/2009 | Cok et al. .................. 313/506 |
| 2009/0102352 | A1* | 4/2009 | Cok et al. .................. 313/498 |
| 2009/0212694 | A1* | 8/2009 | Cok ........................ 313/506 |

FOREIGN PATENT DOCUMENTS

WO    02/10845    2/2002

\* cited by examiner

*Primary Examiner*—Peter Macchiarolo
(74) *Attorney, Agent, or Firm*—Morgan Lewis & Bockius LLP

(57) ABSTRACT

A light-emitting diode device, including a substrate; and a reflective electrode and a semi-transparent electrode formed over the substrate and an unpatterned white light-emitting layer formed between the reflective electrode and the semi-transparent electrode, the reflective electrode, semi-transparent electrode, and unpatterned white-light-emitting layer forming an optical microcavity, and wherein either the reflective or semi-transparent electrodes is patterned to form a plurality of independently controllable light-emitting elements with at least one light-emitting element having no color filter. Color filters are formed over a side of the semi-transparent electrodes opposite the unpatterned white light-emitting layer in correspondence with the light-emitting elements, the color filters having at least two different colors. Additionally, a reflected-light absorbing layer is located over all of the light-emitting elements.

16 Claims, 7 Drawing Sheets

Fig. 7 - Prior Art

LED DEVICE HAVING IMPROVED CONTRAST

FIELD OF THE INVENTION

The present invention relates to light-emitting diode (LED) devices, and more particularly, to LED device structures for improving light output and ambient contrast.

BACKGROUND OF THE INVENTION

Emissive flat-panel display devices are widely used in conjunction with computing devices and in particular with portable devices. These displays are often used in public areas with significant ambient illumination.

Organic light emitting diodes (OLED) have many advantages in a flat-panel display device and are useful in optical systems. U.S. Pat. No. 6,384,529 issued May 7, 2002 to Tang et al. shows an OLED color display that includes an array of OLED light emitting elements (pixels). Light is emitted from a pixel when a current is passed through an organic material, the frequency of the light depending on the nature of the organic material that is used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, which is it is emitted equally in every direction. Because OLED devices typically employ a reflective back electrode, ambient light is typically reflected and the contrast of the display is of great concern. Similarly, inorganic LED devices, for example comprising quantum dots in a polycrystalline semiconductor matrix, located between a reflective electrode and a transparent or semi-transparent electrode, suffer from ambient contrast concerns.

The ambient contrast ratio of a display is a performance factor that requires high-light emission combined with a low reflectivity. Because LED devices typically employ a reflective back electrode, providing a good ambient contrast ratio can be problematic. It is known to use a circular polarizer affixed to the surface of the display so that light incident on the display is absorbed by the polarizer, while light emitted by the display is not. For example, WO0210845 A2 entitled, "High Durability Circular Polarizer for use with Emissive Displays" published Feb. 7, 2002 describes a high durability circular polarizer including an unprotected K-type polarizer and a quarter-wavelength retarder. This circular polarizer is designed for use with an emissive display module such as an organic light emitting diode or a plasma display device. However, while effective in reducing reflections in high-ambient light conditions, for example, outdoors on sunny days, such polarizers do not always provide adequate contrast and they absorb more than half of the emitted light.

Other methods of improving contrast and readability in a display rely on increased light output. For example, microcavity structures are known to increase the light emitted from an OLED device structure. Such optical cavity structures are also known as microcavities or optical microcavities (and are used interchangeably herein) and rely on a patterned deposition of different color light-emitting organic materials over a substrate between a reflective electrode and a semi-transparent electrode. Light emitters having different colors are formed within an optical cavity tuned to a desired peak wavelength of light corresponding to the color of light emitted by the patterned organic materials. U.S. Pat. No. 6,680,570 describes an organic light-emitting device with improved color control employing spacer layers to form an optical cavity. FIG. 7 illustrates such a prior-art, active-matrix, bottom-emitting microcavity device employing a substrate 10 with active-matrix thin-film components 30, planarization structures 32 and 34, and a semitransparent electrode 12. Patterned organic materials 14R, 14G, and 14B corresponding to red, green, and blue light emission are deposited in a light-emitting layer 14. Optical spacers 26R, 26G, and 26B are employed to form optical cavities 60, 62, and 64 tuned to the desired peak wavelengths of red, green, and blue light, respectively to emit red light 80, green light 82, and blue light 84. A cover 20 can be employed to protect and encapsulate the device. While such designs are useful, they require a patterned organic material deposition technology that is difficult to scale to large substrates. Moreover, microcavity devices typically suffer from an unacceptable angular dependence on color. It is also known to employ a color filter with a microcavity structure, for example as taught in U.S. Pat. No. 7,189,238. However, while useful, such an approach does not improve the manufacturability of the device and provides inadequate contrast ratio under some illumination conditions.

U.S. Pat. No. 5,554,911 entitled "Light-emitting elements" describes a multi-color light-emitting element having at least two optical microcavity structures with respectively different optical lengths determining their emission wavelengths. Each microcavity structure includes an organic material as a light-emitting region, which may be a single film of uniform thickness in the element. U.S. Pat. No. 6,861,800 entitled "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a metallic electrode layer spaced from the metallic bottom-electrode layer. The material for the semitransparent metallic electrode layer includes Ag, Au, or alloys thereof. The thickness of the semitransparent metallic electrode layer, the combined thickness of the organic layers and the transparent conductive phase-layer, and also the placement of the light-emitting layer are selected so that each pixel in the display forms a tuned microcavity OLED device having an emission output efficiency above that of a comparable OLED device without the microcavity. U.S. Pat. No. 5,949,187 describes an OLED with a first microcavity including a first transparent spacer and a first mirror stack positioned on the first spacer to reflect light back into the OLED and to define an optical length of the first microcavity. The optical length of the first microcavity being such that light emitted from the first microcavity has a first spectrum. A second microcavity includes a second transparent spacer positioned adjacent the first microcavity and a second mirror stack positioned on the second spacer reflects light toward the first microcavity and defines an optical length of the second microcavity. The optical length of the second microcavity being such that light emitted from the second microcavity has a second spectrum. Additional microcavities can be placed in the structure to further enhance and alter the light spectrum. Such designs, however, may have increased manufacturing costs, lower light output than desired, and reflectance larger than may be desired, as well as significant color change with changes in viewing angle.

US20060066228 A1 entitled, "Reducing or eliminating color change for microcavity OLED devices" by Antoniadis, discloses a microcavity OLED device that minimizes or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again such designs may have increased manufacturing costs and reflectance larger than may be desired.

U.S. Pat. No. 7,030,553 entitled, "OLED device having microcavity gamut sub-pixels and a within gamut sub-pixel" by Winters et al discloses an example of a prior-art microcavity device. This disclosure describes an OLED device including an array of light emitting pixels, each pixel including sub-pixels having organic layers including at least one emissive layer that produces light and spaced electrodes. There are at least three gamut sub-pixels that produce colors that define a color gamut and at least one sub-pixel that produces light within the color gamut produced by the gamut sub-pixels. At least one of the gamut sub-pixels includes a reflector and a semitransparent reflector which function to form a microcavity. However, this design employs a patterned semi-transparent electrode that can be difficult to manufacture in a top-emitting format. Moreover, applicants have determined that color purity may be reduced in such a design and reflectance will likely be larger than desired.

One approach to overcoming material deposition problems on large substrates is to employ a single emissive layer, for example a white-light emitter, together with color filters for forming a full-color display, as is taught in U.S. Pat. No. 6,987,355 entitled "Stacked OLED Display having Improved Efficiency" by Cok and commonly assigned herewith. However, the use of color filters substantially reduces the efficiency of the device.

There still remains a need, therefore, for an improved light-emitting structure that overcomes shortcomings in the prior art and that increases the light output and ambient contrast ratio of an LED device.

SUMMARY OF THE INVENTION

The present invention is directed to a light-emitting diode device that includes a substrate. A reflective electrode and a semi-transparent electrode are formed over the substrate and an unpatterned white light-emitting layer is formed between the reflective electrode and the semi-transparent electrode. Accordingly, the reflective electrode, semi-transparent electrode, and unpatterned white-light-emitting layer, form an optical microcavity. Either the reflective or semi-transparent electrode is patterned to form independently controllable light-emitting elements with at least one light-emitting element having no color filter. Additionally, a plurality of color filters is formed over a side of the semi-transparent electrodes opposite the white light-emitting layer in correspondence with the light-emitting elements, the color filters having at least two different colors. Finally, a reflected-light absorbing layer is located over all of the light-emitting elements.

ADVANTAGES

The present invention has the advantage that it increases the light output and ambient contrast of an LED device.

It will be understood that the figures are not to scale since the individual layers are too thin and the thickness differences of various layers too great to permit depiction to scale.

DETAILED DESCRIPTION OF THE INVENTION

Figure 1:
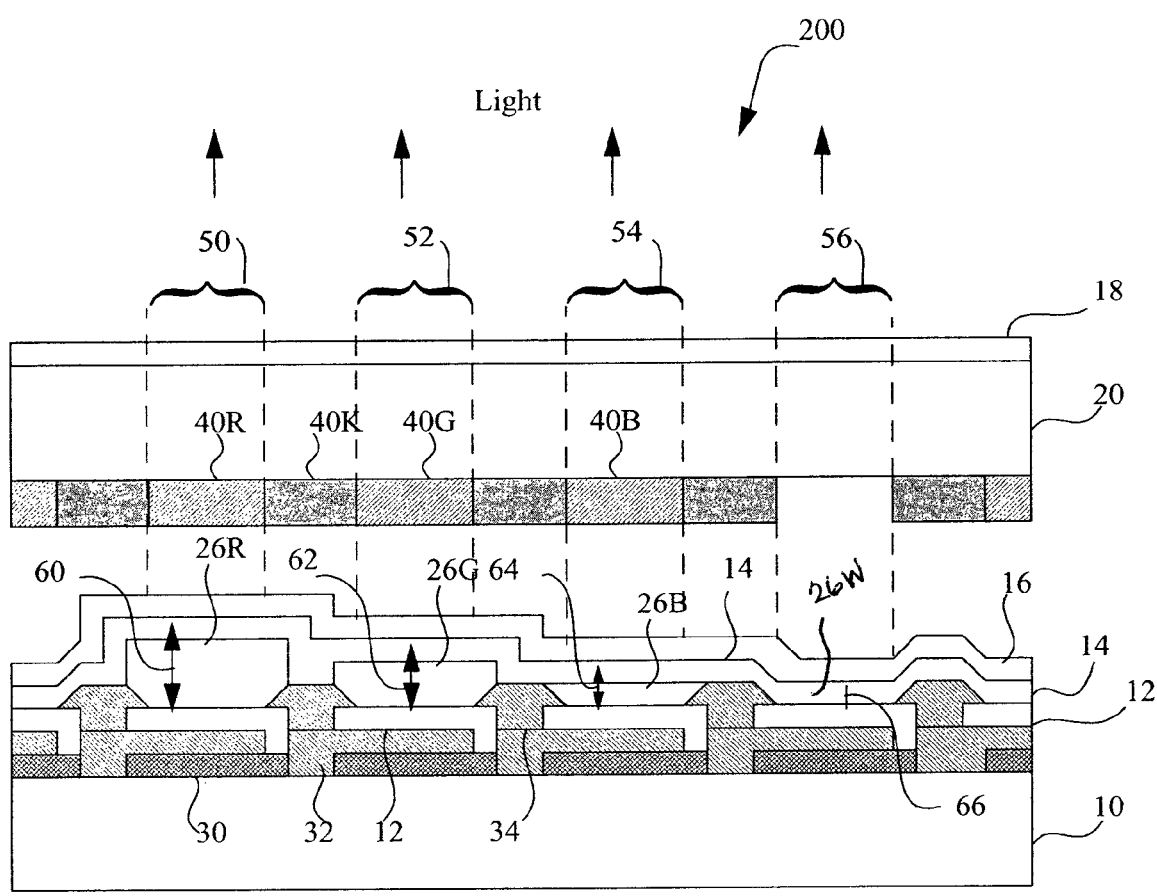
FIG. 1 illustrates a partial cross section of a top-emitter LED device according to an embodiment of the present invention.

Referring to FIG. 1, a light-emitting diode device according to an embodiment of the present invention comprises a substrate 10, a reflective electrode 12, and a semi-transparent electrode 16 formed over the substrate 10. Either the reflective electrodes 12 or semi-transparent electrodes 16 is patterned to form a plurality of independently controllable light-emitting elements 50, 52, 54, and 56. The independently controllable light-emitting elements are controlled, for example by thin-film electronic components 30 formed on the substrate 10. The other electrode may be unpatterned and electrically common to all of the light-emitting elements. An unpatterned white light-emitting layer 14 is formed between the reflective electrode 12 and the semi-transparent electrode 16. Reflective electrode 12, semi-transparent electrode 16, and unpatterned white-light-emitting layer 14 form optical microcavities 60, 62, 64, and 66. A plurality of color filters 40R, 40G, and 40B are formed over a side of the semi-transparent electrode 16 opposite the white light-emitting layer 14 in correspondence with the light-emitting elements 50, 52, 54 with at least one light-emitting element 56 having no color filter, the color filters 40R, 40G, and 40B having at least two different colors, and a reflected-light absorbing layer located over all of the light-emitting elements 18. A black matrix 40K can be employed to absorb ambient light between the light-emitting elements 50, 52, 54, 56. Planarizing and insulating layers 32 and 34 are provided to electrically separate the independently controllable light-emitting elements.

As employed in the present invention, a pixel is a multi-color picture element comprising three or more sub-pixels, each sub-pixel includes an independently controlled light emitter emitting light of a different color. Typically, pixels include red, green, and blue sub-pixels (an RGB configuration). In addition, as employed in this disclosure, a white sub-pixel is also included in each pixel (an RGBW configuration). When a white sub-pixel is employed in an RGBW configuration, if the white sub-pixel has a greater luminous efficacy than any of the red, green, or blue sub-pixels (as will generally be true due to the lack of a color filter over the white sub-pixel) increased brightness or reduced power utilization is obtained for images containing regions having low-to-moderate color saturation (i.e. having a significant gray component). The light-emitting elements 50, 52, 54, 56 correspond to sub-pixels.

Figure 10:
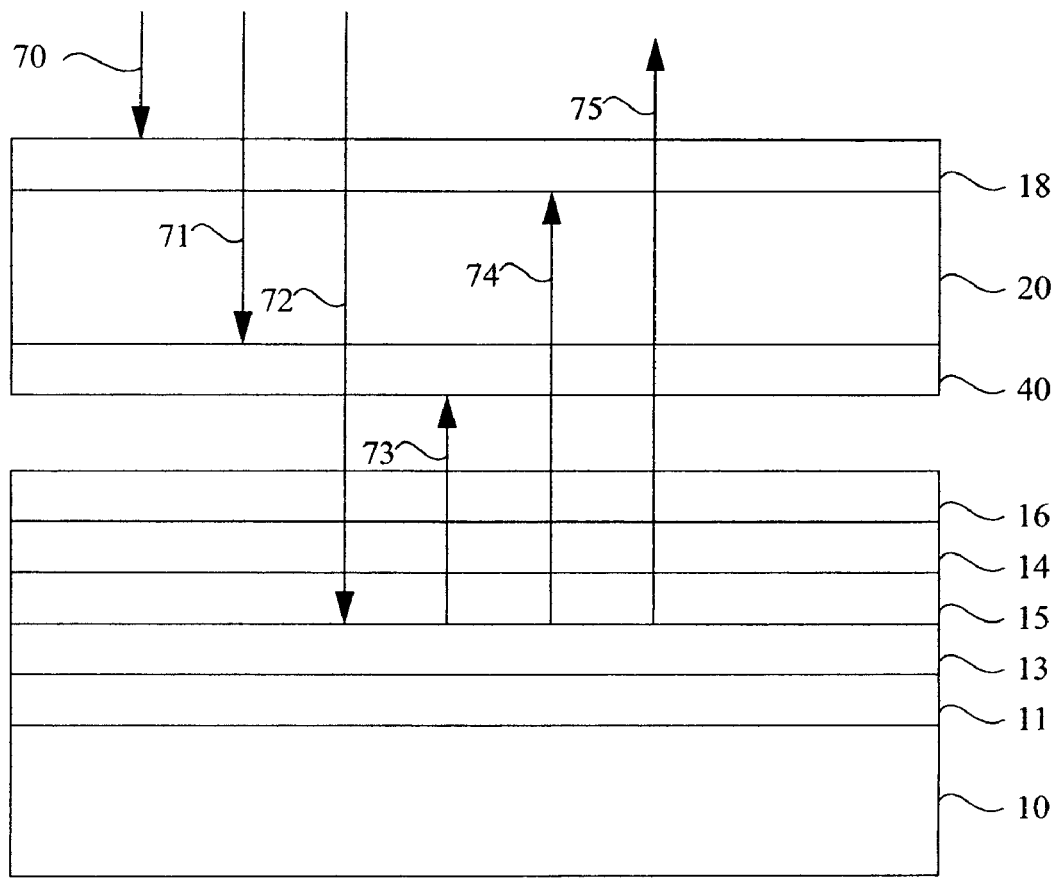
FIG. 10 is a partial cross-section of an LED device exemplary illustrating absorption of ambient light according to an embodiment of the present invention.

The reflected-light absorbing layer 18 preferentially absorbs ambient light that passes through it and that is reflected from the reflective electrode 12, and passes through the reflected-light absorbing layer 18 again (as is shown in FIG. 10 and discussed in more detail below). The ambient light is preferentially absorbed relative to the emitted light from the unpatterned light-emissive layer 14 (even if the light emitted from the unpatterned light-emissive layer 14 is reflected from the reflective electrode 12). For example, in one embodiment of the present invention, the reflected-light absorbing layer 18 may be a circular polarizer. Alternatively, a neutral density filter may be employed.

The optical microcavities 60, 62, and 64 are typically tuned to preferentially emit light with the same peak frequency as the corresponding color filters 40R, 40G, and 40B, thus providing the desired color saturation and gamut of the device. The optical microcavity 66 can be tuned to preferentially emit light corresponding to a peak emission of the white light emitter 56. The optical cavity associated with the white light-emitting element 56 may be tuned to optimize the color(s) of light emitted by the unpatterned light-emitting layer 14, for example to meet a desired white point. That is, the optical cavity of each light-emitting element having a color filter is tuned to emit light at a peak wavelength approximately corresponding to the peak transmission wavelength of the color filter. The white light emitted by the unpatterned light-emitting layer 14 may not be on the Planckian locus, but is preferably at least a broadband light.

As shown in FIG. 1, the present invention may employ spacer layers 26R, 26G, 26B, and 26W having different thicknesses between the reflective electrode 12 and the light-emissive layer 14. The different thicknesses are chosen to tune the optical response of the different optical cavities 60, 62, 64. In an alternative embodiment, shown in FIG. 3, the optical cavities may be tuned by employing transparent spacer layers 13R, 13G, 13B, and 13W between a reflective layer 11 and a transparent conductive layer 15, the reflective layer 11 and transparent conductive layer 15 comprising the reflective electrode 12. In other embodiments of the present invention (not shown) spacer layers may be located in other positions, for example, between the light-emissive layer 14 and the semi-transparent electrode 16.

Note that, since an optical microcavity structure tends to produce sharp resonance peaks in the spectrum, it is difficult to produce the broadband emission necessary for the white sub-pixel. Hence, in FIG. 1, it is preferable to have the spacer layer 26W of sufficient thickness that the optical microcavity produces multiple resonance peaks within the visible spectrum in order to produce a good white color. In order to avoid the need for such a thick spacer layer and to produce a white sub-pixel likely having higher efficiency, we now discuss other exemplary embodiments.

Figure 2:
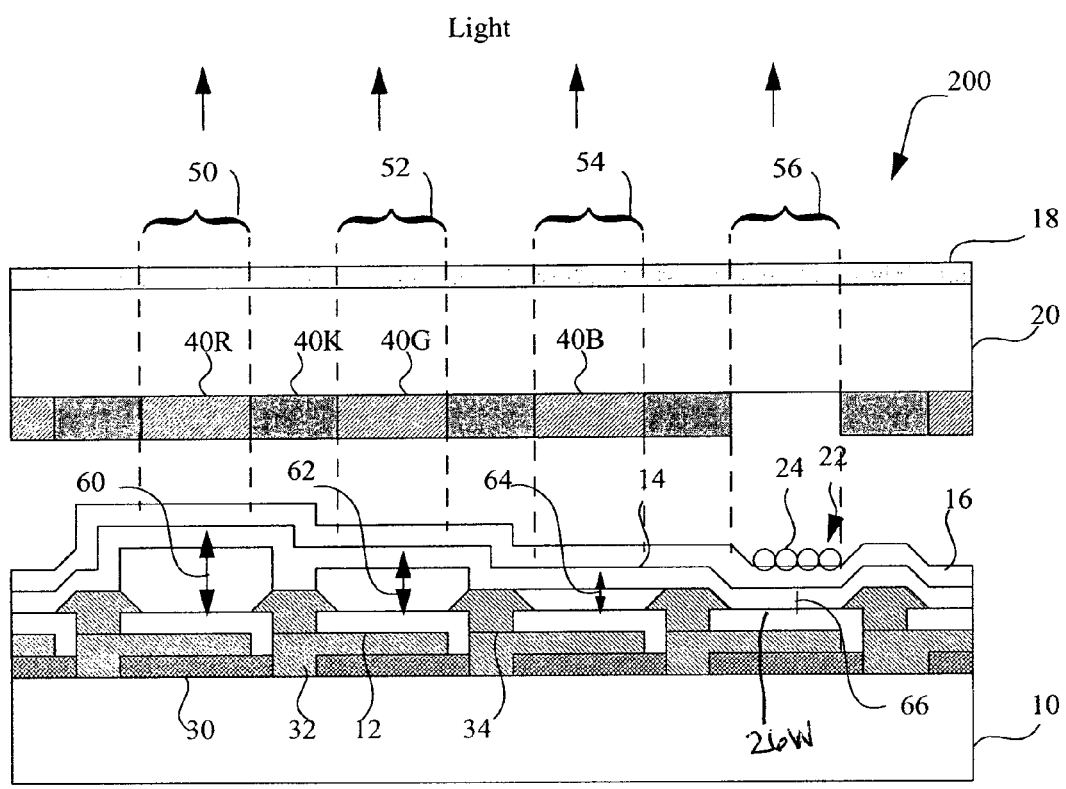
FIG. 2 illustrates a partial cross section of a top-emitter LED device according to another embodiment of the present invention.
Figure 4:
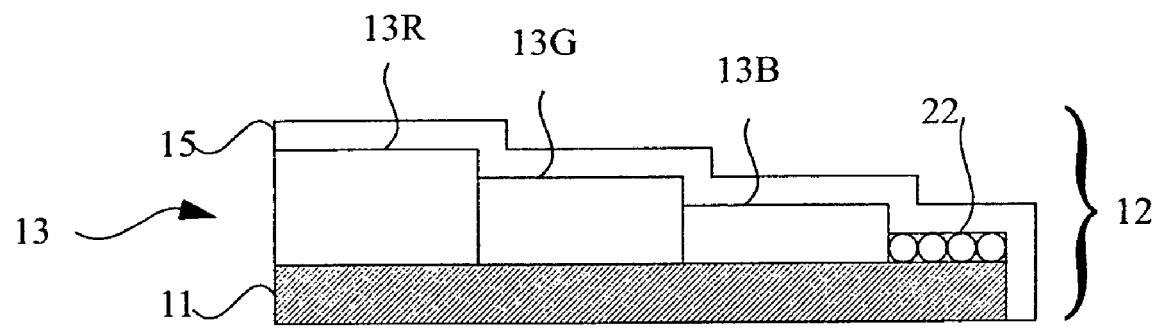
FIG. 4 illustrates optical spacers and a light scattering layer useful with various embodiments of the present invention.

Referring to another embodiment in FIG. 2, a light-scattering layer 22 of light-scattering particles 24 scatters light emitted by the light-emitting element 18 that has no color filter (i.e., the W sub-pixel) light-scattering layer 22 is located on or near a high-index layer of the sub-pixel to mix together the different colored light that would, in the absence of layer 22, be emitted at different angles (including some at angles beyond the critical angle for total internal reflection, hence light would not be able to escape the device), thereby producing a broadband spectrum even with a relatively thin spacing layer 26W. By frustrating total internal reflection, light-scattering layer 22 can also increase the total amount of emitted light. According to some embodiments of the present invention, the light-scattering layer 22 of light-scattering particles 24 can be located over the semi-transparent electrode 16 on a side of the semi-transparent electrode 16 opposite the white light-emitting layer 14 (as shown in FIG. 2) or between a reflective layer 11 and conductive transparent layer 15 comprising electrode 12 (as shown in FIG. 4).

Figure 5:
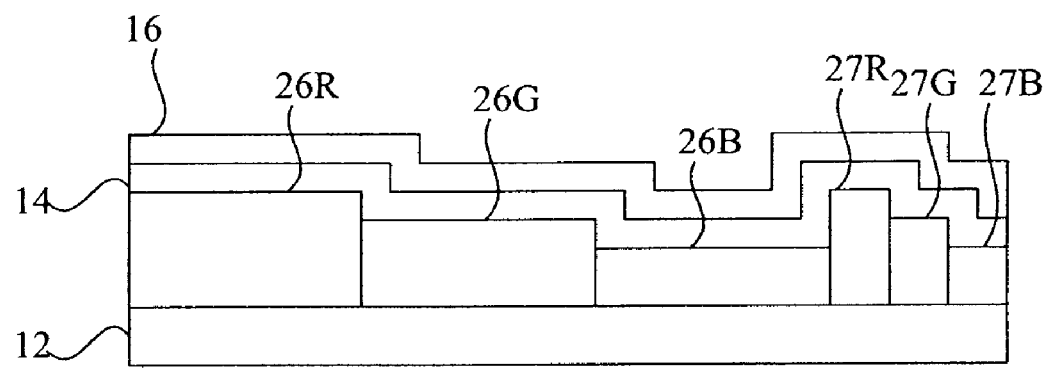
FIG. 5 illustrates optical spacers useful with another embodiment of the present invention.

Referring to FIG. 5 in yet another exemplary embodiment, the optical cavity of one or more of the light-emitting elements that have no color filter comprises a plurality of optical microcavities 27R, 27G, 27B, each optical microcavity tuned to emit light at a different wavelength. The different wavelengths may, in combination, be perceived as white. For example, complementary colors of light can be employed, for example, blue and yellow or red and cyan light. In alternative embodiments, the optical microcavities are tuned to primary colors of light, for example red, green, and blue. In yet other alternatives, more colors can be employed, for example, red, orange, yellow, green, cyan, and blue light that together are perceived as white.

In yet another alternative embodiment, the optical cavity length of the optical microcavity of one or more of the light-emitting elements that have no color filter may vary continuously, rather than in steps. Such a continuous change in the optical cavity length of the optical microcavity is considered to define a plurality of optical microcavities, each optical microcavity tuned to emit light at a different wavelength.

The light-emitting layer may comprise organic materials, for example OLED or PLED materials. Alternatively, the light-emitting layer can comprise inorganic materials, for example, quantum dots formed in a poly-crystalline semiconductor matrix. The light-emitting layer emits a spectrum having peaks, for example having two or more peaks, wherein the two or more peaks correspond to the desired colors of emitted light. The frequencies of the peaks are of complementary colors or of primary colors as noted above.

Figure 6:
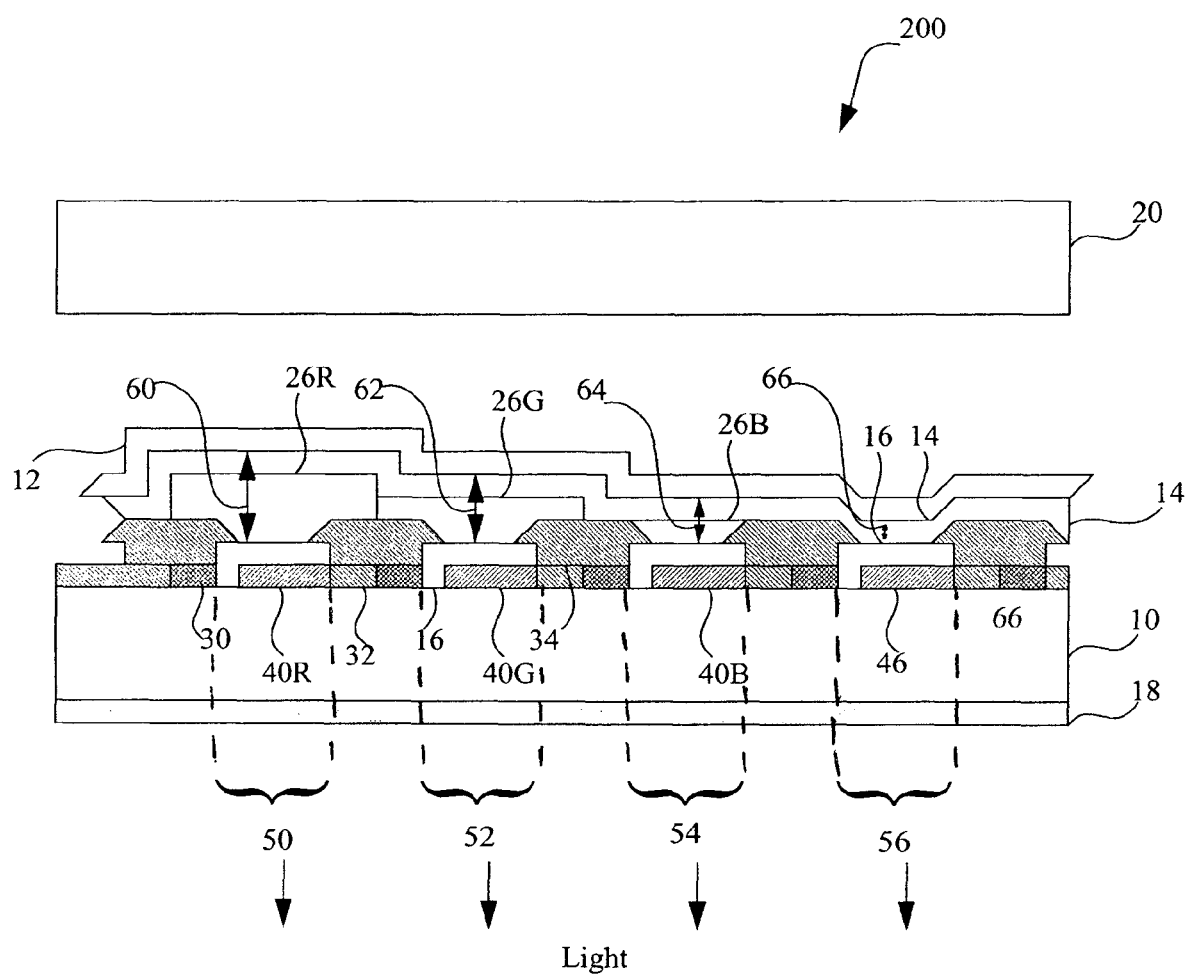
FIG. 6 illustrates a partial cross section of a bottom-emitter LED device according to an embodiment of the present invention.

In one embodiment, the present invention is a top-emitter device, as shown in FIG. 1. In an alternative embodiment, the device is a bottom-emitter device, as shown in FIG. 6.

Current, for example as supplied through thin-film transistors, passes through the light-emitting layer, causing light to be emitted. Some of the emitted light passes directly out of the device or through the color filters and out of the device. Other light is reflected from the reflective electrode 16 and passes out of the device. Other light, emitted at a higher angle to the normal, is trapped via total internal reflection. The microcavity structures serve to reduce the angle of emission of the emitted light, thereby, reducing the amount of trapped light and also focusing more of the desired light in the forward direction. If a scattering layer is present, the scattering layer serves to scatter out the trapped light, although the optical effectiveness of the microcavity may then be reduced. Emitted light passes through the circular polarizer once and light that is not polarized in the direction of the circular polarizer is absorbed, reducing the amount of emitted light.

Referring to FIG. 10, ambient light 70 incident on the device passes first through the circular polarizer 18 and at least half of the ambient light is absorbed. A portion of the remaining ambient light 71 is then absorbed by the color filters 40 (for the color sub-pixels) and then a further portion 72 is absorbed by the microcavity structures. That light not absorbed by the microcavity structures and reflected from the back electrode 12 then passes into the color filters 40 (where present) and a further portion of light 73 is absorbed. The circular polarizer then absorbs almost all of the remaining, reflected light 74 so that the externally reflected ambient light 75 is greatly reduced as described further below.

Figure 8:
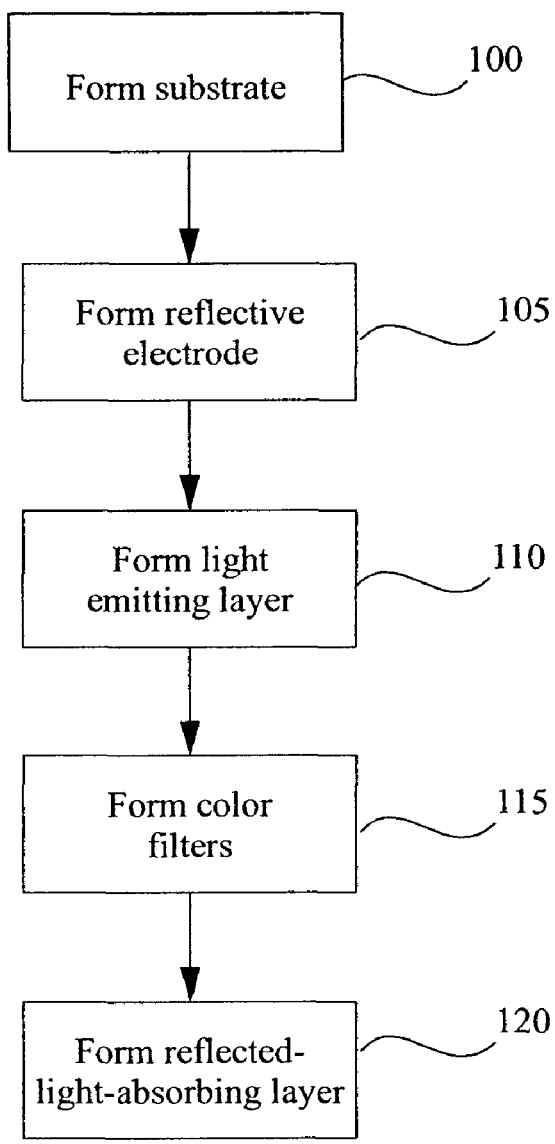
FIG. 8 is a flow-chart illustrating a method of the present invention.

Referring to FIG. 8, an LED device can be formed using the following steps: step 100: forming a substrate, step 105: forming a reflective electrode and a semi-transparent electrode over the substrate, step 110: forming an unpatterned white light-emitting layer between the reflective electrode and the semi-transparent electrode, wherein the reflective electrode, semi-transparent electrode, and unpatterned white-light-emitting layer form an optical microcavity, and wherein at least one of the reflective or semi-transparent electrodes is patterned to form a plurality of independently controllable light-emitting elements with at least one light-emitting element having no color filter, step 115: forming a plurality of color filters over a side of the semi-transparent electrodes opposite the white light-emitting layer in correspondence with the light-emitting elements, the color filters having at least two different colors, and step 120: forming a reflected-light absorbing layer over all of the light-emitting elements.

In a patterned device, different materials are employed to emit light of different colors in response to a current. In contrast, in an unpatterned device, the same materials are employed to emit a single color, for example, white; and the light emitted by color sub-pixels is colored by employing color filters in combination with the white-light emitter. Often, a white-light emitter will include a combination of materials in one or more unpatterned layers that each emit a different color, for example, blue and yellow, to emit a light that is perceived, overall, to be white. The important point is that however many organic materials are included in a single layer, or however many layers are included, the layers are unpatterned and their aggregate emission employed in all of the sub-pixels in all of the pixels.

It is known in the prior art that, in LED devices, light may be trapped by total internal reflection in the high-optical-index layers that actually emit light, or high-optical index charge-control layers, or high-optical index transparent electrodes. Light emitted at low angles to the normal may be emitted from the device while light emitted at a relatively higher angle to the normal may be trapped in the high-optical-index layers. By employing a microcavity structure, the emission of light at high angles is reduced so that more light is emitted from the device at relatively lower angles to the normal. In an alternative technical approach, light-scattering materials defeat total internal reflection and may also increase the amount of light emitted from such a device.

However, it is also true that the color of light emitted from microcavity structures has a dependence on the viewing angle. This angular dependence can be extremely irritating to viewers, in particular for applications in which a large viewing angle is valued. In contrast, as demonstrated by applicant, a light-scattering layer has no such dependence. This color shift with angle is especially noticeable for color sub-pixels using a white-light emitter. However, the color filters employed in the present invention not only absorb ambient light, they also reduce the observed dependence on angle of the light color that one normally has with a microcavity device.

The white-light sub-pixel will also shift in color. However, because the white-light sub-pixel of FIG. 1 typically employs a multi-peak white-light emitter, the shift in color will largely be a shift in white point rather than a shift to a specific color. While this shift may change the observed white point of the device, when combined with a relatively minor color shift in the color sub-pixels, or embodiment of the present invention having a white-point shift provides improved image quality. When the viewing angle is increased, the light emission typically has a shorter wavelength. However, when at least two complementary colors are emitted from the white-light-sub-pixel, the average white color emitted by the two or more colors together remains relatively constant compared to the changes in color of the individual color.

Figure 3:
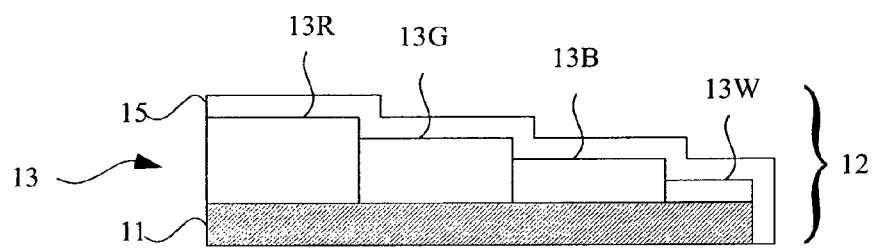
FIG. 3 illustrates optical spacers useful with various embodiments of the present invention.

When the configuration of FIG. 2 is employed, the color of white-light emission does not change with angle and a good white point for the device is maintained when the device is viewed at angles other than the normal. When the configuration of FIG. 3, is employed, the multiple cavities employed in the white sub-pixel has an even greater effect than that of FIG. 1, in that the light emitted by the multiple peaks may shift together, but the perceived color shift is reduced and only an unobjectionable, minor white-point shift may be observed.

However, the color shift reduction found with increasing angle for the color sub-pixels provided by the present invention does reduce the luminance of these color sub-pixels. Such a reduction in luminance is less noticeable and objectionable to viewers than a shift in color. Moreover, to the extent that the color sub-pixels decrease in luminance, while the luminance of the white sub-pixels is constant (although a white-point shift may occur) as a result of changing viewing angles, the net effect may be a reduction in overall color saturation. Such a color saturation reduction may be negligible for some images (i.e. those images with little saturated color) and less noticeable than a change in color for those images with strongly saturated colors. Hence, improved image quality may be obtained. Moreover, since most images are relatively unsaturated, the net effect is often relatively minor.

The ambient contrast ratio of an LED device is a critical factor in its performance, in particular for outdoor applications where ambient illumination can be extremely high. Ambient contrast is defined as a ratio of the light emitted by the device and the ambient light reflected from the device. An improved performance is obtained when light emission is increased and light reflection is decreased. According to the present invention, an improvement in LED device performance is found by increasing the light output by employing a microcavity structure and a white sub-pixel, while ambient light reflection is decreased by employing color filters for the color sub-pixels and a microcavity absorber for all of the sub-pixels, together with a circular polarizer. Moreover, by employing an unpatterned white-light emitter, manufacturing costs are decreased for large-size glass substrates for large-size display devices. In particular, the present invention may be employed for display devices, especially large-format display devices, for example, large-screen televisions or monitors.

Applicants have constructed numerous OLED devices employing microcavities, both with patterned, colored emitters and with white emitters and have studied their performance together with the performance of circular polarizers and color filters. Moreover, optical modeling tools have been employed to understand the performance of the present invention under a variety of circumstances. In general, a white-light-emitting, unpatterned OLED device, employing a microcavity and color filters, can be expected to roughly double the light output of the colored pixels in comparison to a white-light-emitting, unpatterned OLED device without a microcavity and color filters. The color sub-pixels will increase in light output the most, while the white-light-emitting sub-pixel will only change in light output by a multiplicative factor of roughly 0.6 to 1.2, since it is more difficult to increase broadband light output than narrow-band light in a microcavity structure. However, since the white-light-emitting sub-pixel is more efficient (by about a factor of three) than the color sub-pixels (because no color filters are employed in the white sub-pixel), the use of a white sub-pixel improves the overall performance of an OLED device as most images have few saturated colors and the more-efficient white-light emitter is used disproportionately. Applicants have demonstrated that the use of such a white sub-pixel in a color filter design can improve the overall display's device performance by a factor of two for imaging applications.

An explicit optical modeling calculation of a device employing a two-peak OLED emitter was performed with a reflective aluminum back electrode 12 and a thin silver semi-transparent electrode 16. With a commercially-available color filter set, the red light output on-axis increased by 2.8 times, the green light output is increased by 2.0 times, and the blue light output is increased by 1.75 times and improved color gamut is obtained. With a proprietary color filter set developed by applicants that allows for improved color gamut at the cost of somewhat decreased efficiency, the factor by which the on-axis light output is increased when the microcavity structure of the present invention is employed is further increased by 5-15% for the red, blue, and green sub-pixels. Again, improved color gamut is also improved due to the microcavity. For the white-light-emitting sub-pixel, the performance of the device of FIG. 1 typically has a lower performance (for example, 0.6 times the output relative to a prior-art device not employing the microcavity structure) compared to the devices shown in FIG. 2 (for example, 1.0 to 1.3 times) and FIG. 3 (for example, 1.0-1.2 times).

By employing an Ag reflective back electrode, the device performance improves further by 5-20%. Thus, if the proprietary color filters are employed together with the Ag reflective back electrode, the red light output may increase by approximately 3.5 times, the green light output may increase by approximately 2.4 times, and the blue light output may increase by approximately 2.1 times, while the white light output may increase by approximately 0.7 to 1.6 times, depending on the configuration.

According to the present invention, ambient light is absorbed by the circular polarizer (for all sub-pixels), the color filters (for the color sub-pixels), and by the microcavities (for all sub-pixels). Note that the color filter thickness is effectively doubled for the ambient light relative to the emitted light since the ambient light reflected from the back electrode of the color sub-pixels passes through the color filters twice. A dual-peak white-light emitter in a microcavity structure will also absorb a significant amount of ambient light (for example half), further reducing reflectivity. In the case of FIG. 2, employing light-scattering particles in the white sub-pixels will decrease the effectiveness of the circular polarizer somewhat, as demonstrated by applicant, for example providing a reflection of 8%, but at the same time can increase light output from the white sub-pixel by approximately a factor of two. This arrangement can provide improved performance in some ambient illumination conditions and for some applications. The example of FIG. 3 can further increase device performance by more effectively emitting light while still doing an excellent job of absorbing ambient light.

Applicants have measured the performance of various attributes of the present invention and modeled the integrated performance of such devices. The performance of various embodiments of the present invention compared to the prior art is summarized in the table below. In this table, the "relative radiance" describes the amount of light emitted on-axis (and is estimated in the case of the structures of FIGS. 1, 2, and 5 by taking an equally-weighted average of the gain factor for the red, green, blue, and white sub-pixels), the "RGB color" refers to the purity of the color sub-pixels, the "white color" refers to the accuracy of the white (i.e. how close the white light is to a standard white point such as D65), the "reflectance" is a measure of the ambient light reflected from the device, and the "angular color white" refers to the change in color of the white-light emission when viewed at angles other than the normal angle. "WRGBW" refers to an unpatterned white-light-emitting LED material with red, green, and blue color sub-pixels, and a white-light sub-pixel. "WRGB" refers to an unpatterned white-light-emitting LED material with red, green, and blue color sub-pixels only. Sub-pixels are all assumed to be the same size, used equally, and the comparison is made to the prior-art configuration with a relative radiance of 1.0 using the best estimate above. A circular polarizer having a single-pass transmission of 44% and allowing 1.6% of ambient light that is incident on a device with an ideal rear reflector to be reflected from the device is used. The proprietary filters referenced above are used for the color filters. No black matrix is employed but, if present, would further decrease the quantity of reflected light.

Figure 7:
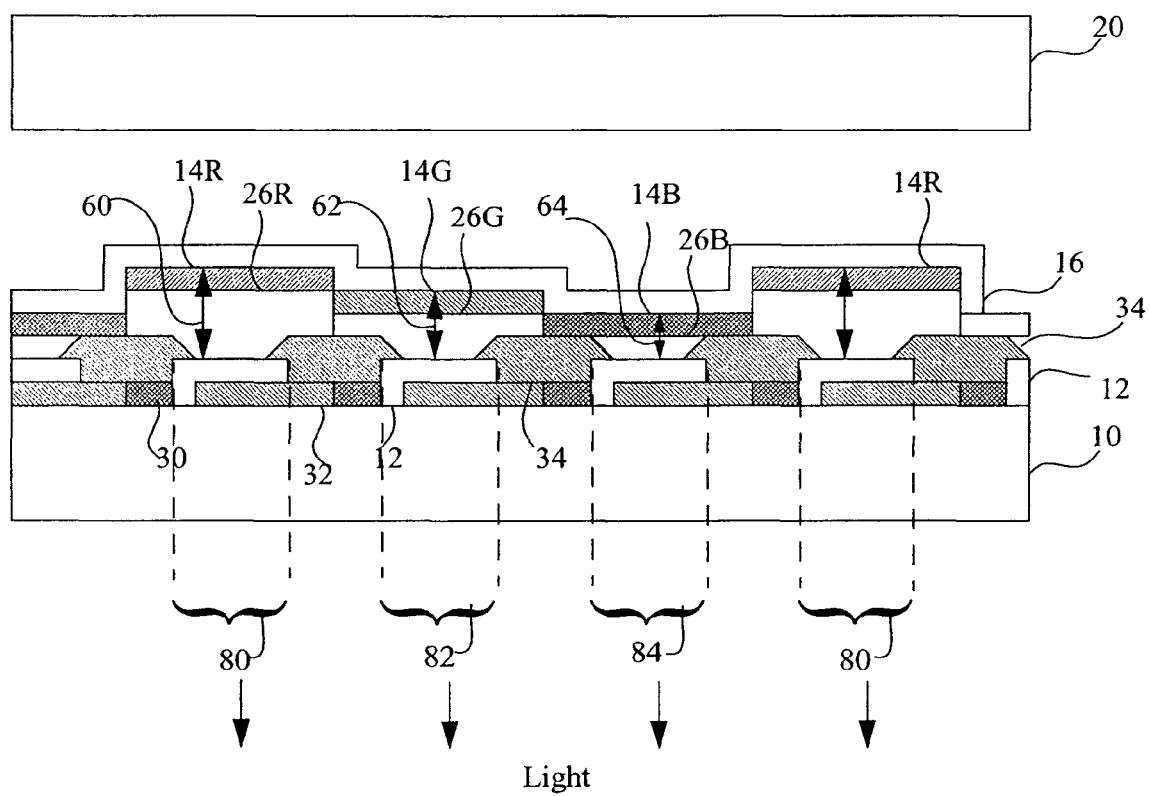
FIG. 7 illustrates a partial cross section of a prior-art bottom-emitter LED device.

| Structure | Relative Radiance | RGB Color | White Color | Overall Reflectance | Angular Color White |
|---|---|---|---|---|---|
| WRGBW - No Microcavity No Circular Polarizer (Prior art) | 1.0 | Good | Excellent | 34% | Moderate |
| WRGBW - No Microcavity with Circular Polarizer (Prior art FIG. 7) | 0.44 | Good | Excellent | 0.5% | Moderate |
| WRGB - Microcavity With Circular Polarizer | 0.44 | Excellent | | 0.06% | |
| WRGBW - Microcavity No Circular Polarizer | ~2.2 | Excellent | Poor | 16% | Poor |
| WRGBW - Microcavity | ~1.0 | Excellent | Poor | 0.25% | Poor |

-continued

| Structure | Relative Radiance | RGB Color | White Color | Overall Reflectance | Angular Color White |
|---|---|---|---|---|---|
| With Circular Polarizer (FIG. 1) WRGBW - Microcavity Circular Polarizer, and Scattering Layer (FIG. 2) | ~1.0 | Excellent | Excellent | 0.7% | Excellent |
| WRGBW - Microcavity, Circular Polarizer, White microcavity sub elements (FIG. 5) | ~1.0 | Excellent | Excellent | 0.25% | Moderate |

As can be seen from the table, the present invention, as embodied in FIGS. 1, 2, and 3, provide an excellent combination of useful features. For the embodiments of FIGS. 1, 2, and 5, the additional light emitted by the microcavity is absorbed by the circular polarizer. In the absence of the circular polarizer, the light output by the embodiments of FIGS. 1, 2, and 5 will increase from a factor of approximately 1.0 to a factor of approximately 2.27 with a consequent increase in reflectivity.

Applicants have also modeled the change in color due to angle of emission for the white sub-pixel of FIG. 5. By employing an overall change in optical cavity thickness of 160 nm for the plurality of optical microcavities in the white sub-pixel, the shift in color due to angle can be reduced to that seen in non-optical-microcavity devices.

Figure 9:
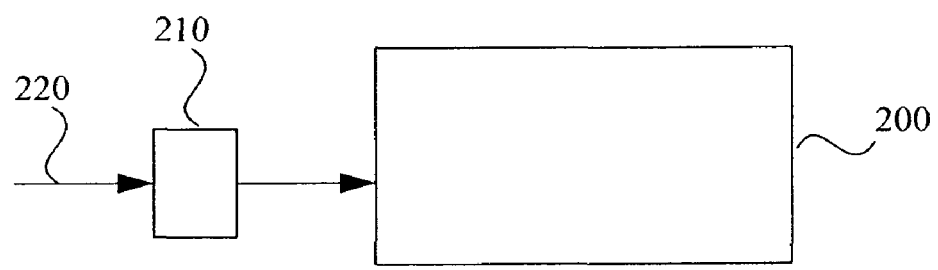
FIG. 9 is a system employing an LED device according to the present invention.

Referring to FIG. 9, the present invention may be employed in a display system comprising an LED device 200 (shown in greater detail in FIGS. 1-6, and discussed thoroughly above) and a controller 210 that drives the LED device 200 in response to a display signal 220.

LED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over or as part of the cover or substrate.

The present invention can be practiced with either active- or passive-matrix OLED devices, and is particularly useful in display devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example employing quantum dots formed in a polycrystalline semiconductor matrix (for example, as taught in Ser. No.11/622,266 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it will be understood that variations and modifications can be effected within the spirit and scope of the invention.

PARTS LIST

| | |
|---|---|
| 10 | substrate |
| 11 | reflective layer |
| 12 | reflective electrode |
| 13, 13R, 13G, 13B, 13W | spacer |
| 14 | light-emitting layer(s) |
| 15 | transparent conductive layer |
| 16 | semi-transparent electrode |
| 18 | reflected-light absorbing layer |
| 20 | cover |
| 22 | light-scattering layer |
| 24 | light-scattering particles |
| 26R, 26G, 26B, 26W | spacer |
| 27R, 27G, 27B | spacer |
| 30 | thin-film circuitry |
| 32 | insulator |
| 34 | insulator |
| 40, 40R, 40G, 40B | color filter |
| 40K | black matrix |
| 50, 52, 54, 56 | light-emitting elements |
| 60, 62, 64, 66 | optical microcavity |
| 70, 71, 72, 73, 74, 75 | light rays |
| 80, 82, 84 | light |
| 100 | form substrate step |
| 105 | form reflective electrode step |
| 110 | form light-emitting layer step |
| 115 | form color filters step |
| 120 | form reflected-light-absorbing layer step |
| 200 | device |
| 210 | controller |
| 220 | signal |

The invention claimed is:

1. A light-emitting diode device, comprising:
   a) a substrate;
   b) a reflective electrode and a semi-transparent electrode formed over the substrate and an unpatterned white light-emitting layer formed between the reflective electrode and the semi-transparent electrode, the reflective electrode, semi-transparent electrode, and unpatterned white light-emitting layer forming an optical microcavity, and wherein either the reflective or semi-transparent electrode is patterned to form a plurality of independently controllable light-emitting elements;
   c) a plurality of color filters formed over a side of the semi-transparent electrodes opposite the unpatterned white light-emitting layer in correspondence with the light-emitting elements, the plurality of color filters having at least two different colors and wherein at least one light-emitting element has no color filter;
   d) a reflected-light absorbing layer located over all of the light-emitting elements; and e) a light-scattering layer that scatters light emitted by the at least one light-emitting element that has no color filter, wherein the reflective electrode comprises a reflective layer and a transparent conductive layer, and the light-scattering layer is formed between the reflective and transparent conductive layers.

2. The light-emitting diode device of claim 1 wherein the reflected-light absorbing layer is a circular polarizer.

3. The light-emitting diode device of claim 1 wherein the device is a top-emitter device.

4. The light-emitting diode device of claim 1 wherein the device is a bottom-emitter device.

5. The light-emitting diode device of claim 1 wherein the optical microcavity of each light-emitting element having a color filter is tuned to emit light at a peak wavelength approximately corresponding to the peak transmission wavelength of the color filter.

6. The light-emitting diode device of claim 1 wherein the at least one light-emitting element that has no color filter comprises a plurality of optical microcavities, each optical microcavity tuned to emit light at a different wavelength.

7. The light-emitting diode device of claim 6 wherein the optical microcavities of the at least one light-emitting element that has no color filter are tuned to emit colors that, in combination, are perceived as white.

8. The light-emitting diode device of claim 6 wherein the optical microcavities of the at least one light-emitting element that has no color filter are tuned to emit complementary colors of light.

9. The light-emitting diode device of claim 8 wherein the optical microcavities of the at least one light-emitting element that has no color filter are tuned to emit blue and yellow light or red and cyan light.

10. The light-emitting diode device of claim 6 wherein the optical microcavities are tuned to emit primary colors of light.

11. The light-emitting diode device of claim 6 wherein the optical microcavities are tuned to emit red, green, yellow, cyan, or blue light.

12. The light-emitting diode device of claim 1, wherein the white light-emitting layer comprises organic materials.

13. The light-emitting diode device of claim 1 wherein the white light-emitting layer comprises inorganic quantum dots formed in a poly-crystalline semiconductor matrix.

14. The light-emitting diode device of claim 1 wherein the white light-emitting layer emits light having a spectrum with two or more peaks, wherein at least one of the peaks has a peak frequency corresponding to the frequency at which the microcavity is tuned.

15. A method of making the LED device, comprising the steps of:
 a) forming a substrate;
 b) forming a reflective electrode and a semi-transparent electrode over the substrate;
 c) forming an unpatterned white light-emitting layer between the reflective electrode and the semi-transparent electrode; wherein the reflective electrode, semi-transparent electrode, and unpatterned white light-emitting layer form an optical microcavity, and wherein either the reflective or semi-transparent electrodes is patterned to form a plurality of independently controllable light-emitting elements;
 d) forming a plurality of color filters over a side of the semi-transparent electrode opposite the unpatterned white light-emitting layer in correspondence with the light-emitting elements, the plurality of color filters having at least two different colors and wherein at least one light-emitting element has no color filter;
 e) forming a reflected-light absorbing layer over all of the light-emitting elements; and
 f) forming a light-scattering layer that scatters light emitted by the at least one light-emitting element that has no color filter,
 wherein the reflective electrode comprises a reflective layer and a transparent conductive layer, and the light-scattering layer is formed between the reflective and transparent conductive layers.

16. A display system comprising:
 an LED device, including:
 a) a substrate;
 b) a reflective electrode and a semi-transparent electrode formed over the substrate and a unpatterned white light-emitting layer formed between the reflective electrode and the semi-transparent electrode, the reflective electrode, semi-transparent electrode, and unpatterned white light-emitting layer forming an optical microcavity, and wherein either the reflective or semi-transparent electrodes is patterned to form a plurality of independently controllable light-emitting elements;
 c) a plurality of color filters formed over a side of the semi-transparent electrode opposite the unpatterned white light-emitting layer in correspondence with the light-emitting elements, the plurality of color filters having at least two different colors and wherein at least one light-emitting element has no color filter;
 d) a reflected-light absorbing layer located over all of the light-emitting elements;
 e) a controller that drives the LED device in response to a display signal; and
 f) a light-scattering layer that scatters light emitted by the at least one light-emitting element that has no color filter,
 wherein the reflective electrode comprises a reflective layer and a transparent conductive layer, and the light-scattering layer is formed between the reflective and transparent conductive layers.

* * * * *